United States Patent [19]
Erickson

[11] Patent Number: 4,819,129
[45] Date of Patent: Apr. 4, 1989

[54] REMOVABLE WATT-HOUR METER SOCKET COMPARTMENT PANEL COVER WITH SAFETY PARTITION

[75] Inventor: Reuben A. Erickson, Park Ridge, Ill.

[73] Assignee: Erickson Electrical Equipment Company, Elk Grove Village, Ill.

[21] Appl. No.: 191,133

[22] Filed: May 6, 1988

[51] Int. Cl.[4] .............................................. H02B 9/00
[52] U.S. Cl. .................................... 361/365; 324/156; 361/360
[58] Field of Search ................ 206/262, 328; 220/3.8, 220/4 D, 22; 324/156; 361/357, 360, 364, 365, 369–371

[56] References Cited

U.S. PATENT DOCUMENTS

| | | | |
|---|---|---|---|
| 3,707,653 | 12/1972 | Coffey | 361/365 |
| 3,746,936 | 7/1973 | Coffet | 361/365 |
| 3,895,179 | 7/1975 | Wyatt | 361/357 |
| 4,413,307 | 11/1983 | Butte | 361/357 |
| 4,489,300 | 12/1984 | Hollenstein | 337/186 |

Primary Examiner—Gerald P. Tolin
Attorney, Agent, or Firm—Kinzer, Plyer, Dorn, McEacran & Jambor

[57] ABSTRACT

A housing assembly for a pair of side-by-side watt-hour meter sockets. The housing assembly includes a rectangular housing having back, side and end walls. A recessed opening is formed in the back wall to receive a standard panel board chassis. An insulated panel closes the recessed opening in the rear wall. A horizontal partition divides the housing into meter socket and switch compartments. A pair of individually removable cover panels are positioned side-by-side to close the front of the meter compartment. An opening is provided in each cover panel to expose a meter to view. An inwardly-extending partition of electrically insulating material is attached to the side of each cover panel which is adjacent to the other cover panel. The partition terminates short of the insulated panel, closing the rear recessed opening of the rectangular housing to protect its meter socket against accidental contact when the other cover panel is removed from the rectangular housing.

2 Claims, 1 Drawing Sheet

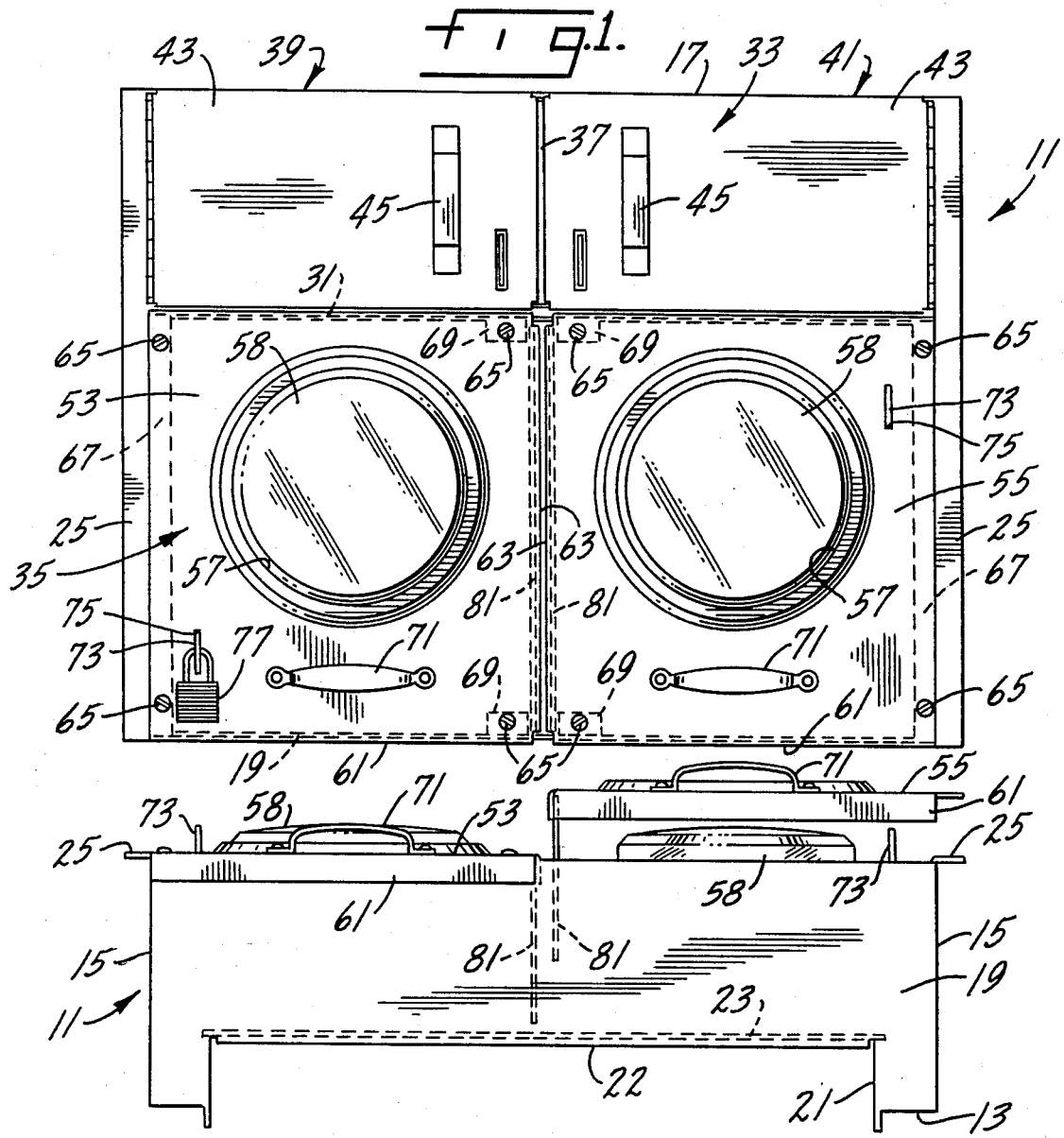

REMOVABLE WATT-HOUR METER SOCKET COMPARTMENT PANEL COVER WITH SAFETY PARTITION

BACKGROUND OF THE INVENTION

This invention relates to a housing for a pair of side-by-side watt-hour meter sockets having a removable cover panel for each socket, which cover panel protects its socket from accidental contact by a worker when the other cover panel is removed.

Side-by-side watt-hour meter sockets have been installed in housing assemblies which are designed for mounting on standard panelboard chassis. Such a housing provides a space-saving arrangement which permits the installation of individual meters for tenants in multiple occupancy buildings and shopping centers without requiring the complete reconstruction of the electrical supply system. Such an arrangement of side-by-side watt-hour meter sockets is shown in my U.S. Pat. No. 4,413,307, issued Nov. 1, 1983.

In the housing assembly shown in that patent, both side-by-side watt-hour meter sockets are exposed when an electrician works on one socket because a single cover panel closes the housing containing both side-by-side sockets. Utility company regulations and those of electrical workers unions in some jurisdictions prohibit the exposure of more than one watt-hour meter socket at any time. This is to prevent injury to a worker, working on one meter socket, from accidental contact with the other meter socket. The provision of separate cover panels for each meter socket would not completely solve this problem since the other meter socket would still be accessible when the workman is reaching inside the housing to work on one meter socket. The provision of a fixed barrier between the pair of side-by-side watt-hour meter sockets has been proposed but has not been proven feasible because of inherent mechanical problems in properly installing such a barrier.

SUMMARY OF THE INVENTION

It is an object of the present invention, therefore, to provide a housing assembly for a pair of side-by-side watt-hour meter sockets in which access can be obtained to each meter socket without exposing the other meter socket to accidental contact by a worker.

A further object of this invention is a housing assembly for side-by-side watt-hour meter sockets in which a removable cover panel is provided for each socket, with each cover panel having a partition of insulating material attached to its side which is adjacent to the opposite watt-hour meter socket.

Accordingly, the invention relates to a housing assembly for a pair of side-by-side watt-hour meter sockets. The housing assembly includes a rectangular housing having back, side and end walls, a recessed opening in the back wall to fit over and receive a standard panelboard chassis containing bus bars and an insulating panel closing the rear recessed opening. A horizontally-extending partition is provided, dividing the rectangular housing into watt-hour meter socket and switch compartments. A pair of removable, rectangular cover panels are positioned side-by-side to close the front of the meter compartment of the rectangular housing. Each cover panel has at least one opening therein for exposing a meter to view. An inwardly-extending partition of insulating material is attached to one side of each panel, the side which is adjacent to the other panel. The partition extends inwardly a sufficient distance to terminate short of the insulated panel closing the rear recessed opening of the rectangular housing to thereby protect its meter socket against accidental contact by a worker when the other cover panel is removed from the housing. Fastener means are provided to individually secure each cover panel against unauthorized displacement or removal from the rectangular housing.

BRIEF DESCRIPTION OF THE DRAWINGS

FIG. 1 is a front elevational view of a housing assembly enclosing a pair of side-by-side watt-hour meter sockets and their fused switches constructed in accordance with this invention;

FIG. 2 is a bottom plan view of the housing assembly of FIG. 1, with some parts removed and one cover panel shown in a partially removed position;

FIG. 3 is a side elevational view of a cover panel shown removed from the housing assembly; and FIG. 4 is a front elevational view of the cover panel of FIG. 3.

DESCRIPTION OF THE PREFERRED EMBODIMENT

FIGS. 1-4 of the drawings illustrate my invention embodied in a housing assembly 11 having a back wall 13, side walls 15, a top end wall 17 and a bottom end wall 19 conventionally formed of sheet metal. The main portion of the back wall 13 is inset, forming a channel 21 (FIG. 2) which permits the housing to be mounted on the side rails of a standard panelboard chassis with space for electrical connections. An opening 22 is formed in the back wall. The panelboard chassis is not shown for simplicity of illustration. A phenolic insulating board 23 forms the inset portion of the back wall to close the opening 22 in the back wall. The flanges 25 of the side walls are bent outwardly (FIGS. 1 and 2) to form the front of the housing assembly 11.

A horizontal partition 31 divides the housing assembly into an upper switch compartment 33 and a lower watt-hour meter compartment 35. A vertical partition 37 further divides the switch compartment into switch subcompartments 39 and 41. A door 43 is hingedly mounted on each of the side wall flanges 25 to close the fronts of the switch subcompartments 39 and 41. Each door is equipped with a handle 45 to facilitate opening and closing the door.

Removable cover panels 53 and 55 are provided to close the watt-hour meter compartment 35. Each cover panel has a circular opening 57 to receive a transparent watt-hour meter globe 58. Each cover panel also has a top flange 59, a bottom flange 61 and one side flange 63. The flange 63 on each cover panel is located on the side of the cover panel which will be located at the middle of meter compartment 35. The removable covers are fastened to the housing by screws 65 which fasten to a flange 67 and to tabs 69 that are a part of the housing assembly 11. Each of the removable cover panels 53, 55 is equipped with a handle 71 t facilitate installation and removal of the cover panel. Two hasps 73 attached to the housing extend through slots 75 in the cover panels 53 and 55 to provide convenient means for locking or sealing the removable cover panels in their closed positions; see padlock 77 in FIG. 1.

A partition 81 of electrical insulating material is riveted or otherwise securely mounted to the side flange 63 of each removable cover panel (FIGS. 3 and 4) to extend inwardly thereof. Each partition 81 is sized to terminate close to but short of the insulating board 23, which forms the part of the back wall of the housing assembly; see FIG. 2. It should be noted that the partitions 81 are located adjacent to each other at the middle of the watt-hour meter socket compartment 35. Thus, removal of one cover panel to provide access to its watt-hour meter socket does not open up the other watt-hour meter socket to accidental contact by a worker because the other removable cover panel has its partition 81 enclosing its portion of the watt-hour meter socket compartment 35.

The removable cover panels 53 and 55 which each carry a safety partition 81 to protect its watt-hour meter socket provide a simple, cost effective solution to a difficult safety problem. The provision of a safety partition carried by each removable cover panel provides protection at a minimum expense and eliminates the need to redesign the watt-hour meter socket housing to accept the installation of a fixed partition between the watt-hour meter sockets. Thus, the invention heretofore described provides not only safety but cost effectiveness.

I claim:

1. A housing assembly for a pair of side-by-side watt-hour meter sockets, the housing assembly including:
   a rectangular housing having back, side and end walls, a recessed opening in said back wall for mounting on a conventional panel board chassis for electrical connection to the bus bars of that chassis, and an electrically insulating rear housing panel closing the rear recessed opening,
   a horizontally-extending partition dividing the rectangular housing into meter socket and switch compartments,
   a pair of individually removable rectangular cover panels positioned side-by-side to close the front of the meter compartment,
   each cover panel having an opening for exposing a watt-hour meter to view,
   an inwardly-extending partition of electrically insulating material attached to the side of each cover panel which is adjacent to the other cover panel,
   each said inwardly-extending partition terminating short of the rear housing panel closing the rear recessed opening of the housing so that each said inwardly-extending partition protects its meter socket against accidental contact when the other cover panel is removed from the housing, and
   means to individually secure each cover panel to the housing against unauthorized displacement or removal.

2. The housing assembly of claim 1 in which each cover panel has one side flange and each inwardly-extending partition is fastened to this flange.

* * * * *